(12) United States Patent
Tsunozaki

(10) Patent No.: US 7,420,281 B2
(45) Date of Patent: Sep. 2, 2008

(54) STACKED CHIP SEMICONDUCTOR DEVICE

(75) Inventor: Manabu Tsunozaki, Hino (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/994,243

(22) Filed: Nov. 23, 2004

(65) Prior Publication Data

US 2005/0116331 A1    Jun. 2, 2005

(30) Foreign Application Priority Data

Nov. 28, 2003    (JP) ............................. 2003-398469

(51) Int. Cl.
*H01L 23/62* (2006.01)

(52) U.S. Cl. .................. 257/777; 257/723; 257/784; 257/E25.03; 257/E23.011

(58) Field of Classification Search .............. 257/777, 257/686, 738, 173, 174, 355, 724, 737, 672, 257/784; 438/738

See application file for complete search history.

(56) References Cited

U.S. PATENT DOCUMENTS

| | | | |
|---|---|---|---|
| 6,141,204 A * | 10/2000 | Schuegraf et al. ........... 361/313 |
| 6,198,136 B1 | 3/2001 | Voldman et al. ............ 257/357 |
| 6,376,904 B1 * | 4/2002 | Haba et al. .................. 257/686 |
| 6,426,560 B1 * | 7/2002 | Kawamura et al. .......... 257/777 |
| 6,433,421 B2 * | 8/2002 | Masuda et al. .............. 257/723 |
| 6,621,155 B1 * | 9/2003 | Perino et al. ................ 257/686 |
| 6,744,141 B2 * | 6/2004 | Kimura ....................... 257/777 |
| 6,777,790 B2 * | 8/2004 | Corisis ........................ 257/676 |
| 6,996,692 B2 * | 2/2006 | Kouno ......................... 711/164 |
| 2001/0011766 A1 * | 8/2001 | Nishizawa et al. .......... 257/685 |
| 2002/0140107 A1 * | 10/2002 | Kato et al. ................... 257/777 |
| 2002/0195697 A1 * | 12/2002 | Mess et al. ................... 257/686 |
| 2003/0199119 A1 * | 10/2003 | Lin ............................. 438/107 |

FOREIGN PATENT DOCUMENTS

JP    10-41458    2/1998

* cited by examiner

*Primary Examiner*—A. Sefer
*Assistant Examiner*—Eddie A Rodela
(74) *Attorney, Agent, or Firm*—Miles & Stockbridge P.C.

(57) ABSTRACT

A stacked chip semiconductor device whose size is substantially reduced by high density packaging of two or more semiconductor chips. In the semiconductor device, four semiconductor chips are stacked over a printed wiring board. The bottom semiconductor chip has an interface circuit which includes a buffer and an electrostatic discharge protection circuit. All signals that these semiconductor chips receive and send are inputted or outputted through the interface circuit of the bottom semiconductor chip. Since the other semiconductor chips require no interface circuit, the semiconductor device is compact.

6 Claims, 9 Drawing Sheets

OUTPUT SELECT SIGNAL

STACKED CHIP SEMICONDUCTOR DEVICE

CROSS-REFERENCE TO RELATED APPLICATION

The present application claims priority from Japanese patent application No. 2003-398469 filed on Nov. 28, 2003, the content of which is hereby incorporated by reference into this application.

BACKGROUND OF THE INVENTION

The present invention relates to technology for miniaturization of semiconductor integrated circuit devices and more particularly to technology, which is effective for stacked chip semiconductor devices in which two or more semiconductor chips are stacked.

With the recent trend toward smaller and higher-performance electronic systems, demand for smaller and higher-density semiconductor integrated circuit devices is growing. One widely-known technique for increasing the density of a package almost equal in size to a semiconductor chip is a semiconductor device with two or more semiconductor chips stacked which is called a stacked CSP (Chip Size Package).

In this stacked chip semiconductor device, two or more semiconductor chips are stacked in the center of a printed wiring board and a lower semiconductor chip is larger than or equal to an upper one.

When a lower semiconductor chip and an upper one are bonded, an adhesive agent in the form of paste or film is coated over the surface of the lower one, over which the upper one is laid.

Bonding pads are made around peripheral areas of the upper and lower semiconductor chips and electrodes made on the printed wiring board are connected with the bonding pads through bonding wires.

In a stacked CSP memory module in which semiconductor chips including semiconductor memories such as flash memories, DRAMs and SRAMs are stacked, external connection terminals such as address terminals and data input/output terminals (I/O terminals) are shared in order to decrease the number of external connection terminals.

One example of technology for miniaturization of stacked chip semiconductor devices is that a package includes an ESD protection circuit and other buffer circuits such as decoupling capacitors, drivers and receivers which are provided on support chips other than a core integrated circuit chip (for example, see Patent Literature 1: Japanese Unexamined Patent Publication No. Hei 10 (1998)-41458).

SUMMARY OF THE INVENTION

However, the inventors have found that the above stacked chip semiconductor device has the following problems.

Although the address terminals and data input/output terminals are shared as mentioned above, the area efficiency in chip layout is low because each semiconductor chip has a function of interfacing with an externally connected module.

As a consequence, it may be difficult to miniaturize the stacked chip semiconductor device and also the device may be not cost-effective.

An object of the present invention is to provide a substantially miniaturized stacked chip semiconductor device through high density packaging of two or more semiconductor chips.

The above and further objects and novel features of the invention will more fully appear from the following detailed description and accompanying drawings.

Typical aspects of the invention will be briefly outlined below.

According to one aspect of the present invention, a semiconductor device has a primary semiconductor chip and at least one secondary semiconductor chip which are stacked. Here, the primary semiconductor chip has a primary electrostatic discharge protection circuit to be connected with an external connection terminal; the secondary semiconductor chip has a secondary electrostatic discharge protection circuit whose protection capability is smaller than that of the primary electrostatic discharge protection circuit; and an external signal is inputted and outputted through the primary electrostatic discharge protection circuit.

According to another aspect of the present invention, a semiconductor device has a semiconductor chip for electrostatic discharge protection, which has a primary electrostatic discharge protection circuit, and at least one secondary semiconductor chip. Here, the secondary semiconductor chip has a secondary electrostatic discharge protection circuit whose protection capability is smaller than that of the primary electrostatic discharge protection circuit; and an external signal is inputted and outputted through the primary electrostatic discharge protection circuit.

Main advantageous effects, which are brought about by the present invention, are as follows:

(1) A compact stacked chip semiconductor device is realized.

(2) Power consumption of a stacked chip semiconductor device is reduced.

(3) The above effects (1) and (2) contribute to miniaturization of electronic systems and reduction in their power consumption.

DETAILED DESCRIPTION OF THE PREFERRED EMBODIMENTS

Figure 1:
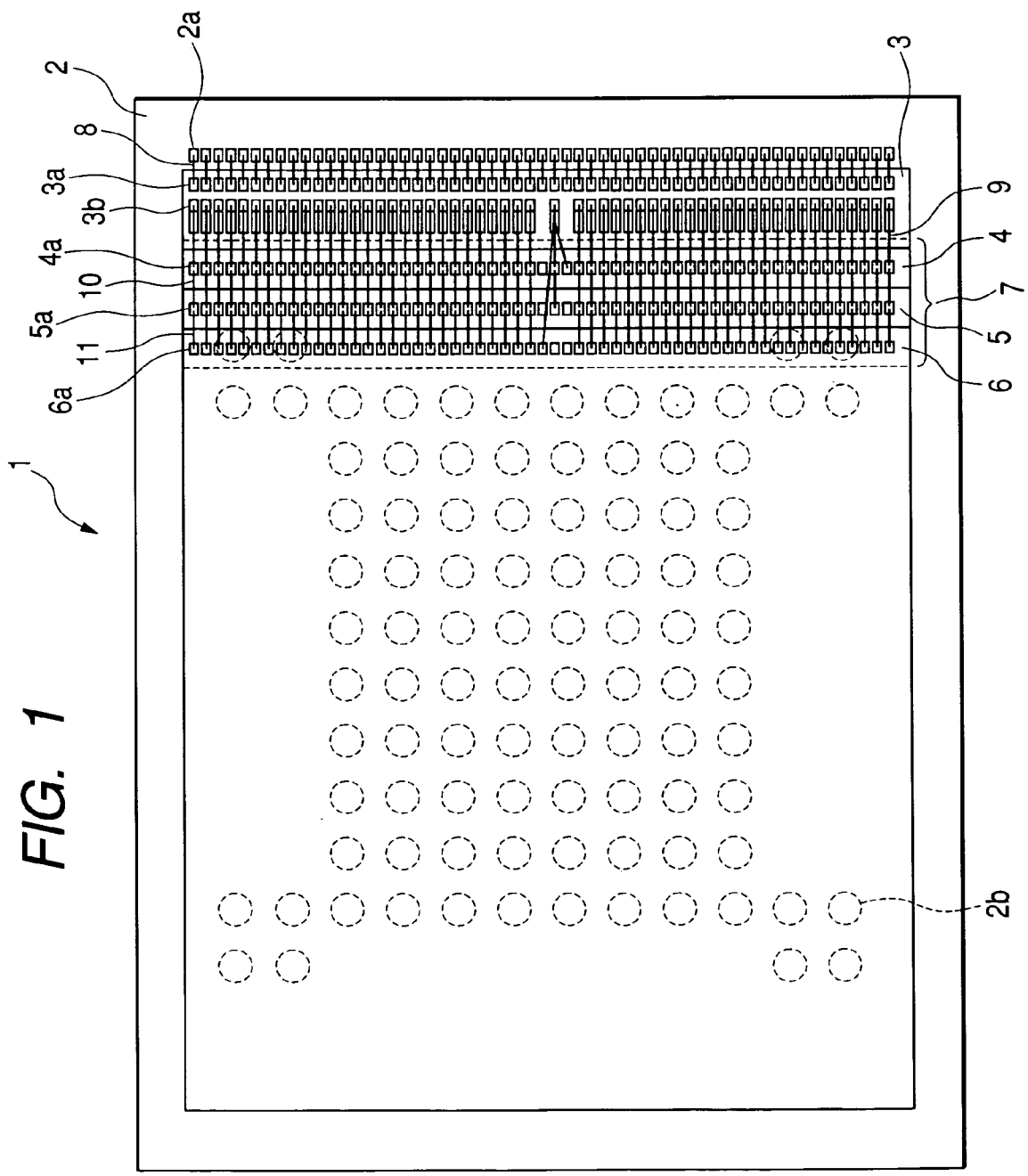
FIG. 1 is a top view of a stacked chip semiconductor device according to a first embodiment of the present invention.

Next, preferred embodiments of the present invention will be described in detail referring to the accompanying drawings. In all the drawings that illustrate the preferred embodiments, like elements are designated by like reference numerals; and descriptions of these elements will not be repeated.

First Embodiment

Figure 2:
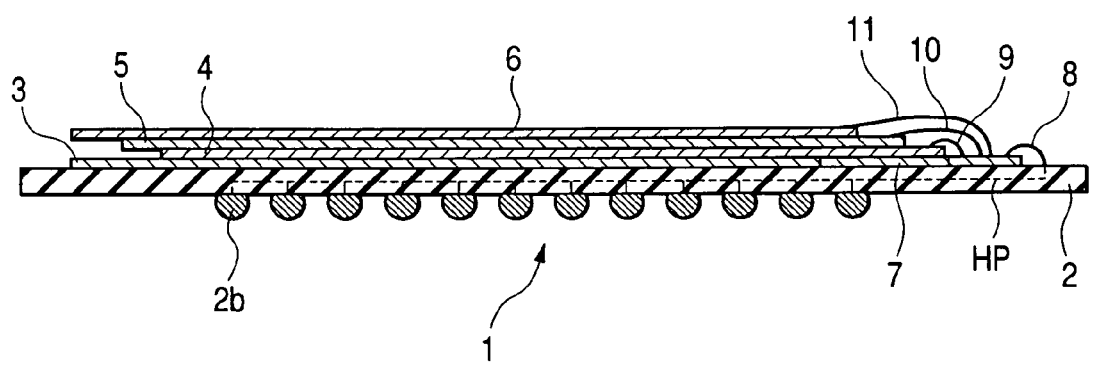
FIG. 2 is a sectional view of the stacked chip semiconductor device of FIG. 1.
Figure 3:
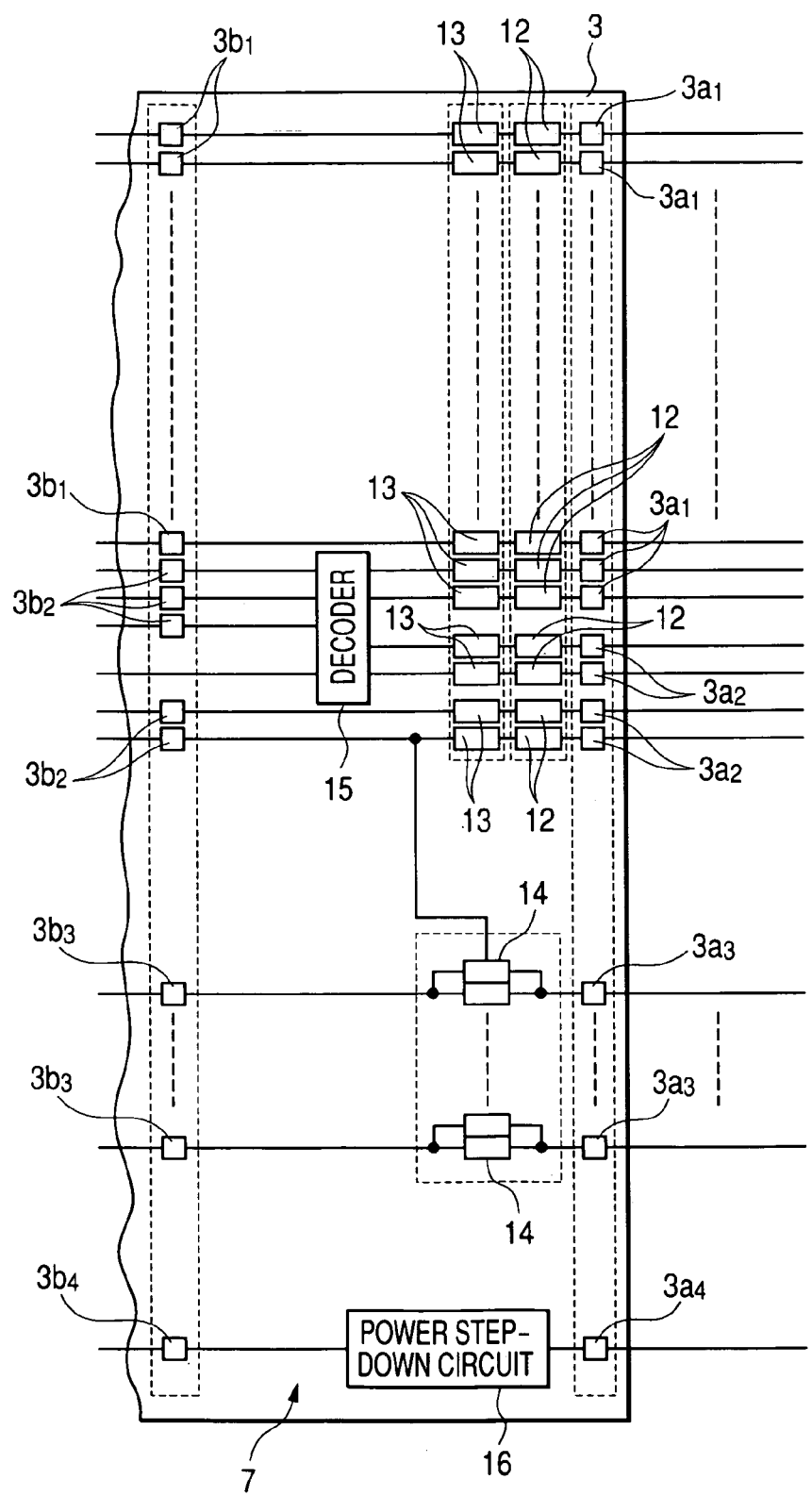
FIG. 3 illustrates an interface circuit in the stacked chip semiconductor device of FIG. 1.
Figure 4:
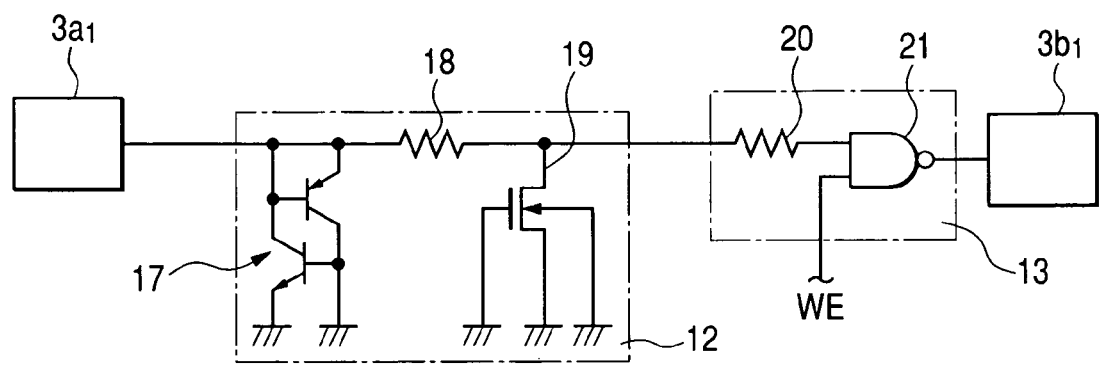
FIG. 4 is a circuit diagram of an ESD protection circuit and an input buffer which are incorporated in the interface circuit of FIG. 3.
Figure 5:
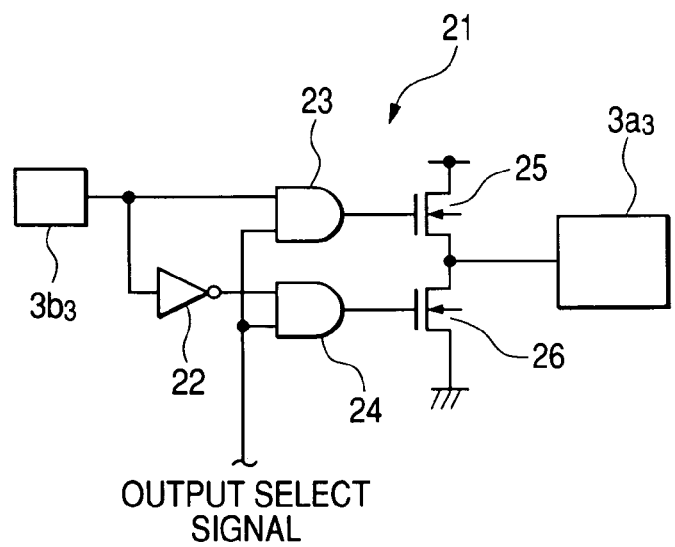
FIG. 5 is a circuit diagram of an output buffer incorporated in the interface circuit of FIG. 3.

FIG. 1 is a top view of a stacked chip semiconductor device according to a first embodiment of the present invention, FIG. 2 is a sectional view of the stacked chip semiconductor device of FIG. 1, FIG. 3 illustrates an interface circuit in the stacked chip semiconductor device of FIG. 1, FIG. 4 is a circuit diagram of an ESD protection circuit and an input buffer which are incorporated in the interface circuit of FIG. 3, and FIG. 5 is a circuit diagram of an output buffer incorporated in the interface circuit of FIG. 3.

In the first embodiment, a stacked chip semiconductor device 1 consists of a BGA (Ball Grid Array) as a kind of surface mount CSP. As shown in FIGS. 1 and 2, the semiconductor device 1 has a printed wiring board 2, for example, made of BT (Bismaleimide Triazine). On the back of the printed wiring board 2 is an array of electrodes for connection.

The printed wiring board 2 has a stacked structure in which semiconductor chips 3 to 6 are stacked in the center of its main surface. The bottom semiconductor chip (primary semiconductor chip) 3 is bonded to the printed wiring board 2 through an adhesive agent such as insulating resin.

The semiconductor chip (secondary semiconductor chip) 4 lies over the semiconductor chip 3 through an adhesive agent such as insulating resin. The semiconductor chip (secondary semiconductor chip) 5 lies over the semiconductor chip 4 and the semiconductor chip (secondary semiconductor chip) 6 lies over the semiconductor chip 5. Likewise, these chips are bonded to each other through an adhesive agent such as insulating resin.

The semiconductor chips 3 to 6 are comprised of semiconductor memories such as nonvolatile memories. The bottom semiconductor chip 3 has a memory section and an interface circuit 7.

The memory section comprises: a control circuit which controls nonvolatile memory read, write and erase operations; a decoder circuit which selects word lines to be accessed; and a memory array including a sense amplifier which amplifies the bit line potential and determines the data read from nonvolatile memory cells. The interface circuit 7 carries out external input/output and includes a buffer which temporarily stores data for external input/output.

The semiconductor chips 4 to 6 respectively have memory sections but no interface functions. The semiconductor chips 4 to 6 are equal in size (area) to each other and smaller than the semiconductor chip 3.

Bonding electrodes 2a are arranged over the main surface of the printed wiring board 2, along one side on the semiconductor chip periphery. The bonding electrodes 2a are electrically connected with connection electrodes by a wiring pattern HP formed in the wiring layer of the printed wiring board 2. Solder bumps 2b (spherical) are made as the connection electrodes on the back surface of the printed wiring board 2.

External connection electrodes 3a are arranged near the bonding electrodes 2a along one side on the periphery of the main surface of the semiconductor chip 3. Internal connection electrodes 3b are arranged on the inside of the external connection electrodes 3a.

The internal connection electrodes 3b are, for example, rectangular and have a larger area than the external connection electrodes 3a. The internal connection electrodes 3b are connected with the memory section of the semiconductor chip 3. The reason that the internal connection electrodes 3b have a larger area than the external connection electrodes 3a is that each internal connection electrode 3b is to be connected to connection electrodes 4a, 5a and 6a of the semiconductor chips 4 to 6 through plural bonding wires while each external connection electrode 3a is to be connected through one bonding wire. This means that if only one semiconductor chip 4 is laid over the semiconductor chip 3, the internal connection electrodes may have the same area as the external connection electrodes 3a. This applies throughout this specification.

Electrodes (connection electrodes) 4a are arranged along one side on the periphery of the main surface of the semiconductor chip 4. These electrodes 4a are each connected to the memory section of the semiconductor chip 4. The semiconductor chip 4 is located in the center of the semiconductor chip 3, adjacent to the internal connection electrodes 3b.

Electrodes (connection electrodes) 5a are arranged along one side on the periphery of the main surface of the semiconductor chip 5. These electrodes 5a are each connected to the memory section of the semiconductor chip 5. The semiconductor chip 5 is located not in the center of the semiconductor chip 4, but decentered (offset) so that the electrodes 5a are exposed from the semiconductor chip 4 and close to the electrodes (connection electrodes) 6a.

Electrodes (connection electrodes) 6a are arranged along one side on the periphery of the main surface of the semiconductor chip 6. These electrodes 6a are each connected to the memory section of the semiconductor chip 6. Like the semiconductor chip 5, the semiconductor chip 6 is decentered (offset) so that the electrodes 6a are exposed from the semiconductor chip 5 and close to the electrodes (connection electrodes) 5a. The semiconductor chips 4 to 6 are sifted to the extent that their electrodes 4a to 6a are exposed and can be connected with the internal connection electrodes 3b.

The semiconductor chips 5 and 6 each partially protrude from the projection plane shared with the underlying chip and there is space beneath their protruding parts. Part of the interface circuit 7 of the semiconductor chip 3 lies in the space beneath the protruding parts. Since the semiconductor chip 3 is larger than the semiconductor chips 4 to 6 and they are stacked in this way, the packaging efficiency is improved.

The bonding electrodes 2a of the printed wiring board 2 are connected to the external connection electrodes 3a of the semiconductor chip 3 through bonding wires 8. The external connection electrodes 3a and the internal connection electrodes 3b are connected each other through the interface circuit 7 of the semiconductor chip 3. The internal connection electrodes 3b and the electrodes 4a to 6a are connected each other through bonding wires 9 to 11.

This means that signals which not only the memory section of the semiconductor chip 3 but also the memory sections of the semiconductor chips 4 to 6 receive and send are all inputted or outputted through the interface circuit 7 of the semiconductor chip 3.

Next, the structure of the interface circuit 7 of the semiconductor chip 3 will be explained.

FIG. 3 shows the external connection electrodes 3a, internal connection electrodes 3b and interface circuit 7 of the semiconductor chip 3.

As shown in FIG. 3, the external connection electrodes 3a are located on the right and the internal connection electrodes 3b on the left and the interface circuit 7 in the center. However, the layout with these elements of the semiconductor chip 3 is not limited thereto.

As shown in FIG. 3, the external connection electrodes 3a are arranged from top to bottom as follows: external connection electrodes $3_{a1}$ which are connected to external address buses; external connection electrodes $3_{a2}$ which receive control signals; external connection electrodes $3_{a3}$ which are connected to external data buses; and an external connection electrode $3_{a4}$ which is connected to an external power line.

As shown in FIG. 3, the internal connection electrodes 3b are arranged from top to bottom as follows: internal connection electrodes $3_{b1}$ which are connected to internal address buses; internal connection electrodes $3_{b2}$ which receive control signals; internal connection electrodes $3_{b3}$ which are connected to internal data buses; and an internal connection electrode $3_{b4}$ which is connected to an internal power line.

The interface circuit 7 includes electrostatic discharge protection circuits (primary ESD protection circuits) 12, input buffers 13, input/output buffers 14, a decoder 15 and a power supply circuit 16.

The external connection electrodes $3_{a1}$ and $3_{a2}$ are connected to the internal connection electrodes $3_{b1}$ and $3_{b2}$ through the ESD protection circuits 12 and input buffers 13, respectively.

Some of the internal connection electrodes $3_{b1}$ and $3_{b2}$ are connected with output of the input buffers 13 connected to the corresponding external connection electrodes $3_{a1}$ and $3_{a2}$ via the decoder 15. And the decoder 15 further receives the address signals and the control signals.

The decoder 15 decodes the address signal and control signal which it has received, and generates and outputs a chip select signal which is for selecting whether to activate or inactivate the memory sections of the semiconductor chips 3 to 6. In writing operation, signals, which are inputted through external data bus, are outputted through an input/output buffer 14 to an internal connection electrode $3_{b3}$, which is connected to an internal data bus. This input/output changeover in the input/output buffer 14 is carried out according to some of the control signals which come from the outside.

The power supply circuit 16 transforms the voltage level of power supplied through the external connection electrode $3_{a4}$ from an external power line to generate internal power supply voltage. The internal power supply voltage generated by the power supply circuit 16 is supplied through the internal connection electrode $3_{b4}$ to the semiconductor chips 3 to 6. The power supply circuit 16 is capable of generating a plurality of internal power supply voltages, which are different voltage levels from And the power supply circuit 16 is capable of including not only the voltage step down circuit but also the voltage step up circuit, for example a charge pump circuit, etc.

Furthermore, the interface circuit 7 may also include a circuit which encodes or decodes address signals or data signals. This substantially improves security of the stacked chip semiconductor device 1.

FIG. 4 illustrates an ESD protection circuit 12 and an input buffer 13 connected between an external connection electrode $3_{a1}$ and an internal connection electrode $3_{b1}$.

The ESD protection circuit 12 prevents discharge current from reaching the internal circuits of the semiconductor chips 3 to 6 or limits the discharge current. The ESD protection circuit 12 comprises a thyristor 17, a resistor 18, and a clamp MOS transistor 19. The input buffer 13 is comprised of a resistor 20 and a NAND circuit 21.

The external connection electrode $3_{a1}$ is connected to one end of the resistor 18. The thyristor 17 is connected between the one end of the resistor 18 and reference potential VSS. The other end of the resistor 18 is connected to one end of the input buffer 13.

The clamp MOS transistor 19 is connected between the other end of the resistor 18 and reference potential VSS. The other end of the resistor 20 is connected to one input of the NAND circuit 21. And the other input of the NAND circuit 21 is connected to a control signal (write enable signal, etc) output from the internal circuit of the semiconductor chip 3. The output of the NAND circuit 21 serves as an output of the input buffer 13.

The ESD protection circuit 12 is a high ESD tolerance circuit. In order to prevent breakdown of the ESD protection circuit 12 itself due to high voltage, its elements are larger than in an internal circuit of a chip core.

On the other hand, since the semiconductor chips 4 to 6 receive and send signals through the interface circuit 7 of the semiconductor chip 3, they only have to withstand at most electrostatic discharge which can occur in an ESD-controlled manufacturing environment. Therefore, they incorporate a relatively simple ESD protection circuit (secondary ESD protection circuit) which is, for example, only composed of a diode and a resistor.

Because the semiconductor chips 4 to 6 do not require a relatively large ESD protection circuit 12, it is possible to decrease their area for layout and achieve remarkable cost reduction.

Next, the circuitry of the input/output buffer 14 (FIG. 3) will be explained.

The input/output buffer 14 is comprised of an input buffer 13 (FIG. 4) and an output buffer 21. FIG. 5 illustrates the structure of the output buffer 21. The output buffer 21 is comprised of an inverter 22, AND circuits 23 and 24, and transistors 25 and 26 for data output.

The input of the inverter 22 and one input of the AND circuit 23 are connected to the internal connection electrode $3_{b3}$. The output of the inverter 22 is connected to one input of the AND circuit 24.

The other inputs of the AND circuits 23 and 24 are connected in a way to receive an output select signal from the internal circuit of the semiconductor chip 3. The output of the AND circuit 23 is connected to the gate of the transistor 25 and the output of the AND circuit 23 is connected to the gate of the transistor 26.

The transistors 25 and 26 consist of, for example, N-channel MOSs (Metal Oxide Semiconductors). They are connected in series between the power supply voltage VCC and the reference potential VSS and the joint of the transistors 25 and 26 is connected to the external connection electrode $3_{a3}$.

A signal from one of the semiconductor chips 3 to 6 goes through the internal connection electrode $3_{b3}$ to the output buffer 21. In this output buffer 21, whether to output the signal or make a high impedance condition is selected according to an output select signal which enters the other inputs of the AND circuits 23 and 24.

The gate width of the transistors 25 and 26 is large enough to obtain a sufficient source-drain current to drive another device (MOS transistor) externally connected with the stacked chip semiconductor device 1 and their gate length is also large enough to obtain a required ESD tolerance at the same time.

Therefore, the transistors 25 and 26 occupy a large space. However, the interface circuit 7 is shared among the semiconductor chips 3 to 6 and the size of the semiconductor chips 4 to 6 can be remarkably reduced.

Hence, according to this embodiment, sharing of the interface circuit 7 of the semiconductor chip 3 permits the use of a fewer number of large transistors necessary for the interface circuit 7, thereby leading to reduction in the cost of the stacked chip semiconductor device 1 and reduction in its power consumption.

Figure 6:
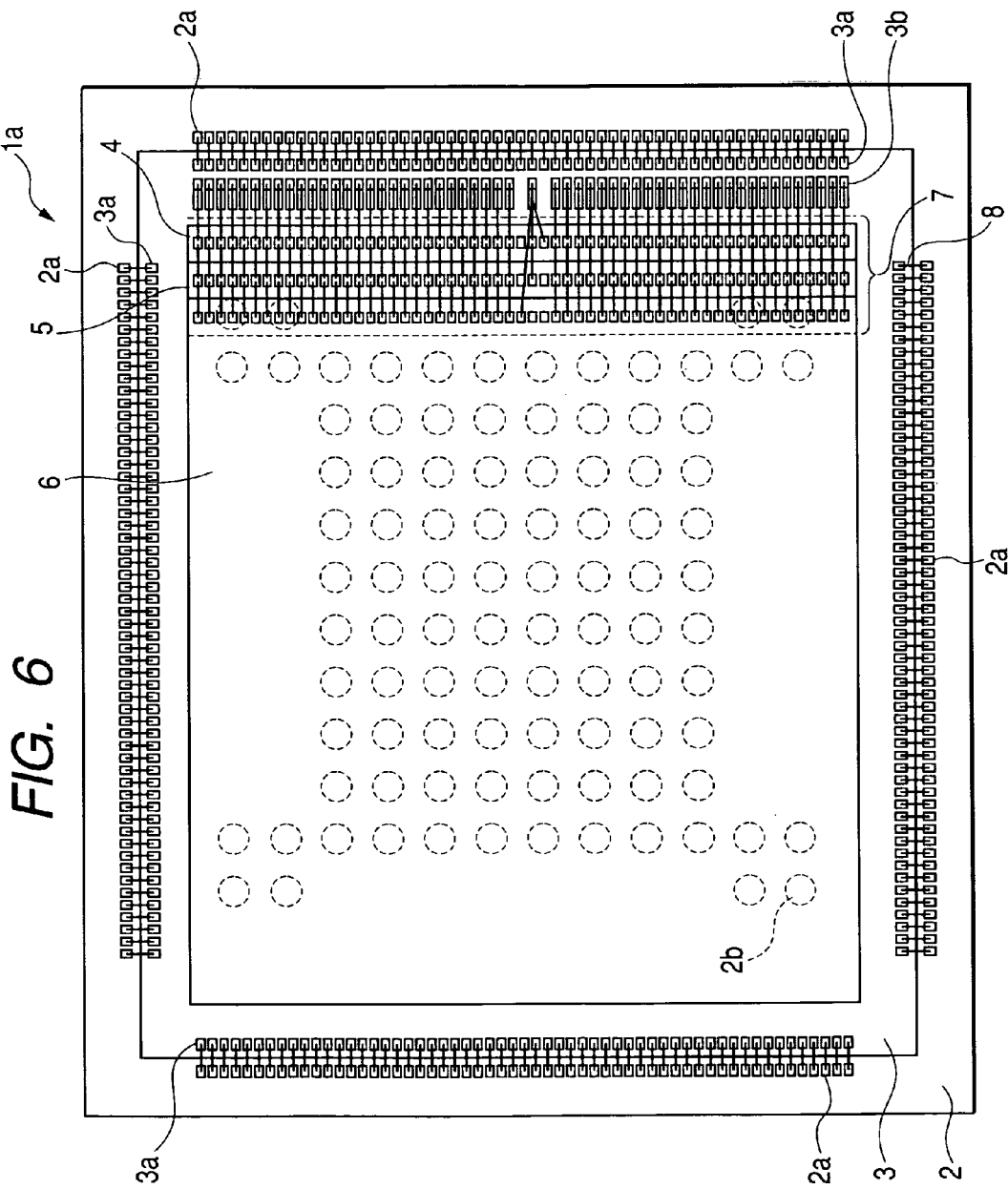
FIG. 6 is a top view of a stacked chip semiconductor device according to another embodiment of the present invention.

Although the external connection electrodes 3a are arranged along one side on the periphery of the main surface of the semiconductor chip 3 in the first embodiment, instead they may be arranged along two or more sides. For example, as shown in FIG. 6, in the stacked chip semiconductor device 1a, external connection electrodes 3a are arranged along the four sides of the semiconductor chip 3. In this case, the bonding electrodes 2a of the printed wiring board 2 are also arranged along the four sides of the printed wiring board 2 and the bonding electrodes 2a and the external connection electrodes 3a are connected through bonding wires 8 respectively.

This allows more latitude in layout and permits reduction in the size of the semiconductor chip 3.

Second Embodiment

Figure 7:
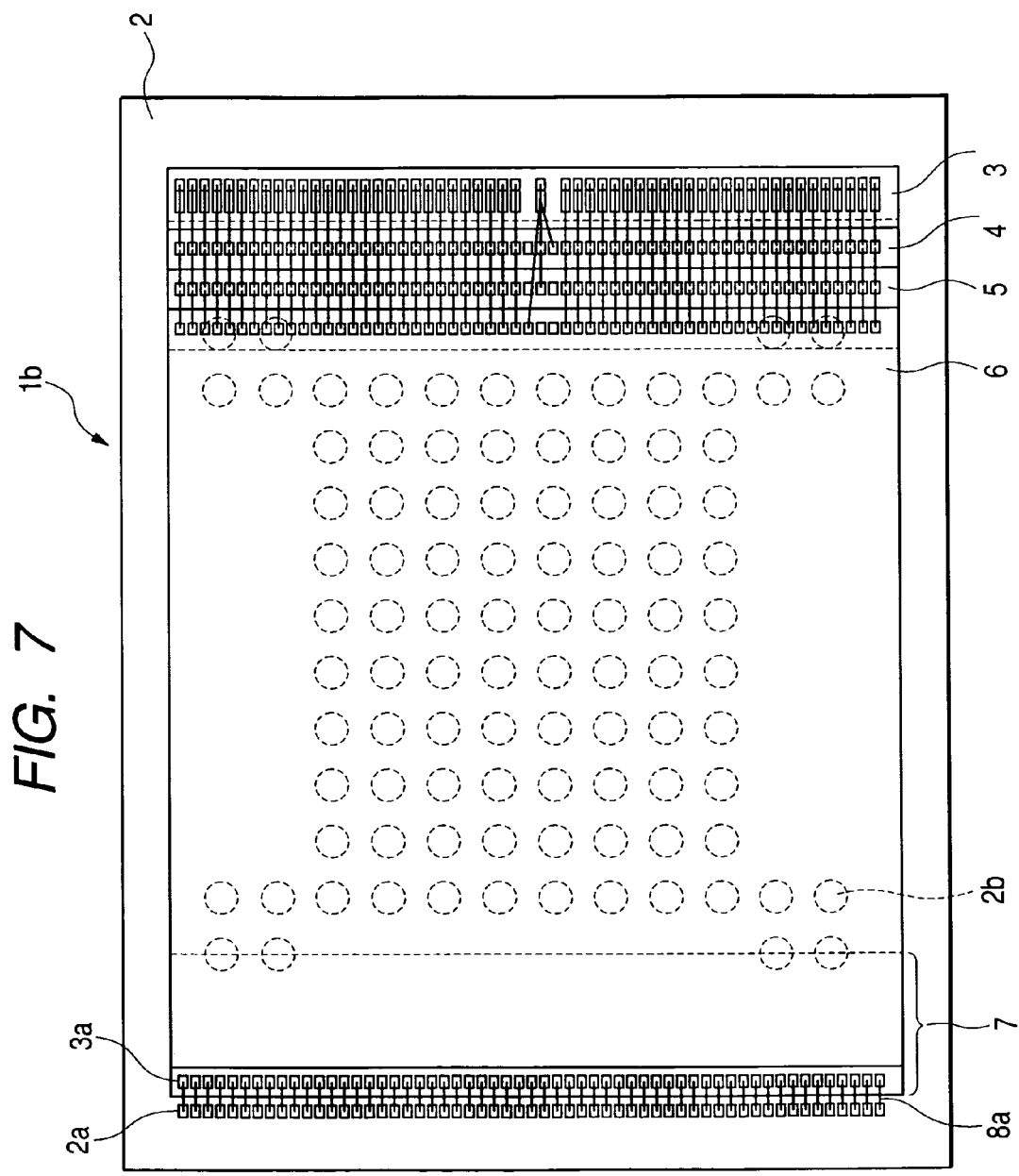
FIG. 7 is a top view of a stacked chip semiconductor device according to a second embodiment of the present invention.
Figure 8:
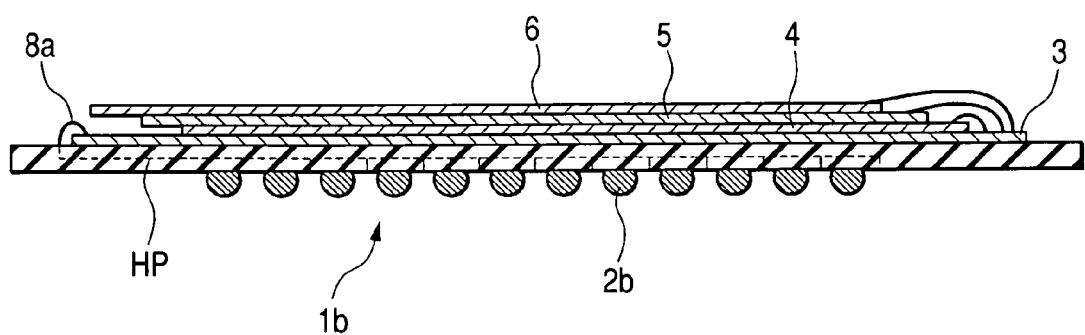
FIG. 8 is a sectional view of the stacked chip semiconductor device of FIG. 7.

FIG. 7 is a top view of a stacked chip semiconductor device according to the second embodiment of the present invention; and FIG. 8 is a sectional view of the stacked chip semiconductor device of FIG. 7.

As shown in FIGS. 7 and 8, in the second embodiment, the stacked chip semiconductor device 1b consists of a BGA with a stacked structure. Like the first embodiment (see FIGS. 1 and 2), the stacked chip semiconductor device 1b includes a printed wiring board 2, solder bumps 2b, semiconductor chips 3 to 6, bonding wires 8a and bonding wires 9 to 11. The difference from the first embodiment is the layout of the interface circuit of the semiconductor chip 3.

The interface circuit 7 is located not on the periphery of the external connection electrodes 3a and internal connection electrodes 3b on the semiconductor chip 3, but on the side facing the side where the external connection electrodes 3a are located.

The connection electrodes are located on the back surface of the printed wiring board 2 as an array. Semiconductor chips 3 to 6 are stacked in the center of the main surface of the printed wiring board 2.

The bonding electrodes 2a are located on the left side of the periphery of the main surface of the printed wiring board 2. The bonding electrodes 2a are electrically connected with connection electrodes by a wiring pattern HP formed in the wiring layer of the printed wiring board 2. Solder bumps 2b (spherical) are made as the connection electrodes on the back surface of the printed wiring board 2.

The electrodes 3a are located near the bonding electrodes 2a, on the left side of the periphery of the main surface of the semiconductor chip 3 and the interface circuit 7 is located on the inside of the external connection electrodes 3a.

The internal connection electrodes 3b are located on the right side of the periphery of the main surface of the semiconductor chip 3. They are, for example, rectangular, and larger than the external connection electrodes 3a. They are connected to the memory section of the semiconductor chip 3.

Like the first embodiment, electrodes 4a to 6a are located on the right side of the periphery of the main surface of each of the semiconductor chips 4 to 6. These semiconductor chips 4 to 6 are stacked in a staggered manner.

The bonding electrodes 2a of the printed wiring board 2 are connected to the external connection electrodes 3a of the semiconductor chip 3 through bonding wires 8a. The external connection electrodes 3a and the internal connection electrodes 3b are connected with each other through the interface circuit 7 and the internal wiring of the semiconductor chip 3. The internal connection electrodes 3b and the electrodes 4a to 6a are connected each other through bonding wires 9 to 11.

Thus, in the second embodiment, for the semiconductor chip 3, the external connection electrodes 3a and internal connection electrodes 3b are separately connected so that the area efficiency of the semiconductor chip 3 is improved.

Third Embodiment

Figure 9:
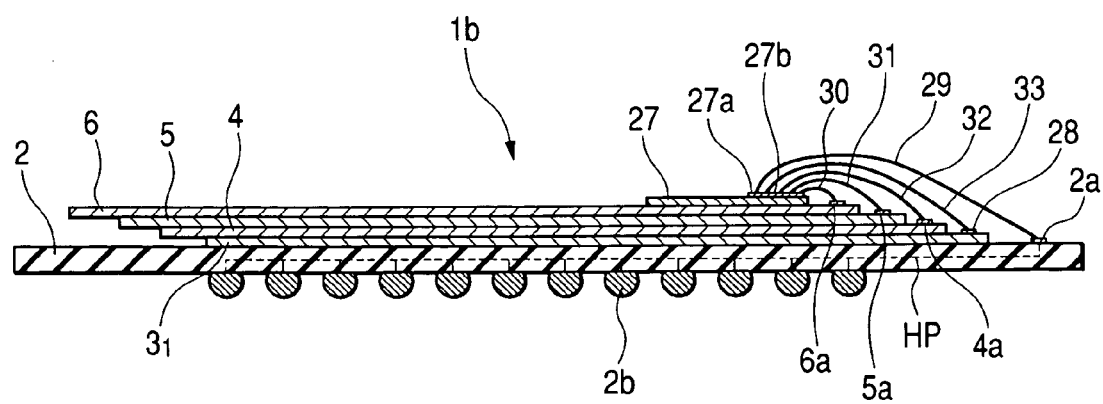
FIG. 9 is a sectional view of a stacked chip semiconductor device according to a third embodiment of the present invention.

FIG. 9 is a sectional view of a stacked chip semiconductor device according to the third embodiment of the present invention.

In the third embodiment, a stacked chip semiconductor device 1c is the same as in the first embodiment except that a semiconductor chip (semiconductor chip with ESD protection) 27 is newly added and semiconductor chips 31, and 4 to 6 only have memory sections.

As shown in FIG. 9, in the stacked chip semiconductor device 1c, the connection electrodes are located on the back surface of the printed wiring board 2 as an array. The semiconductor chips 31, and 4 to 6 are stacked in the center of the main surface of the printed wiring board 2 and the additional semiconductor chip 27, on which an interface circuit 7 (FIG. 3) is structured, lies over the semiconductor chip 6.

The bonding electrodes 2a are located on the right side of the periphery of the main surface of the printed wiring board 2. The bonding electrodes 2a are electrically connected with connection electrodes by a wiring pattern HP formed in the wiring layer of the printed wiring board 2. Solder bumps 2b (spherical) are made as the connection electrodes on the back surface of the printed wiring board 2.

External connection electrodes 27a are located on the left side of the periphery of the main surface of the semiconductor chip 27 and internal connection electrodes 27b are located on the right of the external connection electrodes 27a. The internal connection electrodes 27b are, for example, rectangular, and larger than the external connection electrodes 3a. They are connected to the memory sections of the semiconductor chips $3_1$ and 4 to 6.

Electrodes (connection electrodes) 28 are located on the right side of the periphery of the main surface of the semiconductor chip (secondary semiconductor chip) $3_1$. Electrodes 4a to 6a are provided on the right side of the periphery of the main surfaces of the semiconductor chips 4 to 6.

The bonding electrodes 2a of the printed wiring board 2 are connected to the external connection electrodes 27a of the semiconductor chip 27 through bonding wires 29. The external connection electrodes 27a and the internal connection electrodes 27b are connected each other through the interface circuit 7 of the semiconductor chip 27.

The internal connection electrodes 27b of the semiconductor chip 27 and the electrodes 28 and 3a to 6a of the semiconductor chips 31 and 4 to 6 are connected through bonding wires 30 to 33.

Thus, in the third embodiment, the addition of the semiconductor chip 27 with an interface function makes it possible to reduce the sizes of the semiconductor chips $3_1$ and 4 to 6 and realize a more compact stacked chip semiconductor device 1c.

When the stacked chip semiconductor device 1c is used to make a multimedia card, it is possible to use the semiconductor chip 27 as a control chip (memory controller).

Figure 10:
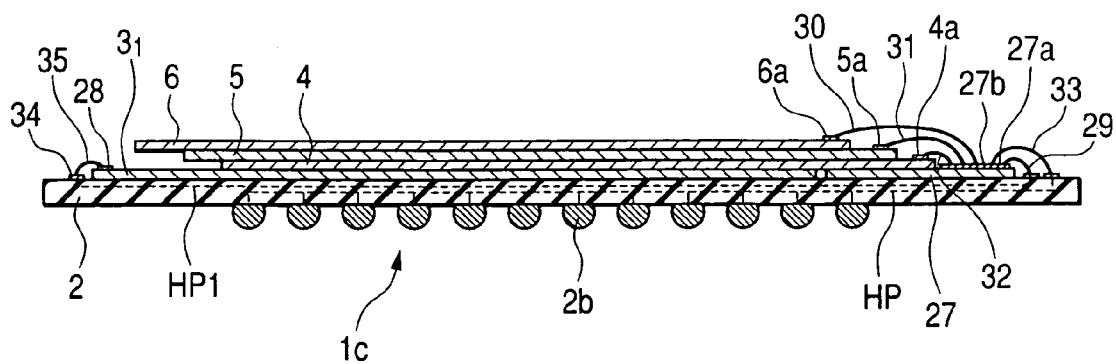
FIG. 10 is a sectional view of a stacked chip semiconductor device according to another embodiment of the present invention.

Although the semiconductor chip 27 is located at the top in the third embodiment, instead it may lie side-by-side with the semiconductor chip $3_1$ at the bottom as shown in FIG. 10.

In this case, the electrodes 28 of the semiconductor chip $3_1$ are located on the left in the peripheral area and are connected to the internal electrodes 27b of the semiconductor chip 27 through bonding electrodes 34 provided on the printed wiring board 2, wiring pattern HP1 and bonding wires 35.

When the semiconductor chip 27 is located at the bottom in this way, if it incorporates a circuit (security means) which encodes/decodes address signals and/or data signals, the security of the stacked chip semiconductor device 1c is substantially increased.

This means that, because the semiconductor chip 27 is hard to detach, someone who tries to reverse-engineer the device might break the semiconductor chip 27.

So far, preferred embodiments of the invention made by the inventors have been concretely described. However, obviously the present invention is not limited to the above embodiments but may be embodied in other various forms without departing from the scope and spirit thereof.

In the first to third embodiments, input/output buses for the memory sections of the semiconductor chips used in the stacked chip semiconductor device need not consist of $2^n$ bits.

Figure 11:
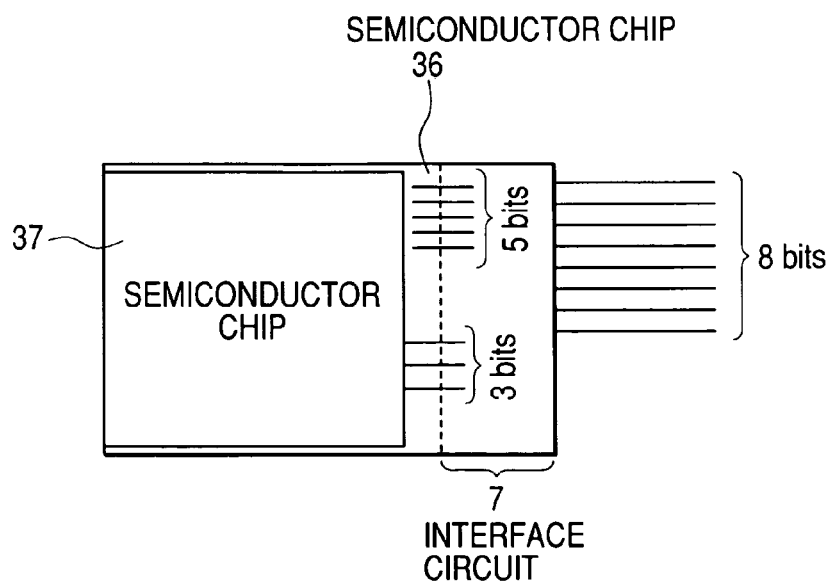
FIG. 11 shows a bit configuration in the memory of a stacked chip semiconductor device according to another embodiment of the present invention.

For example, it is also possible that when a semiconductor chip (primary semiconductor chip) 36, which has a memory of 1M words×5 bits and an interface circuit 7, is combined with a semiconductor chip (secondary semiconductor chip) 37 having a memory of 1M words×3 bits as shown in FIG. 11, they are regarded as a single memory of 1M words×8 bits by an external interface.

Consequently, the memory packaging form can be diversified to suit the available packaging space and the device can be mounted in a module or memory card whose shape is restricted, and its memory capacity can be increased.

In the first to third embodiments, address space in the memory sections of the semiconductor chips used in the stacked chip semiconductor device need not consist of $2^n$ bits.

Figure 12:
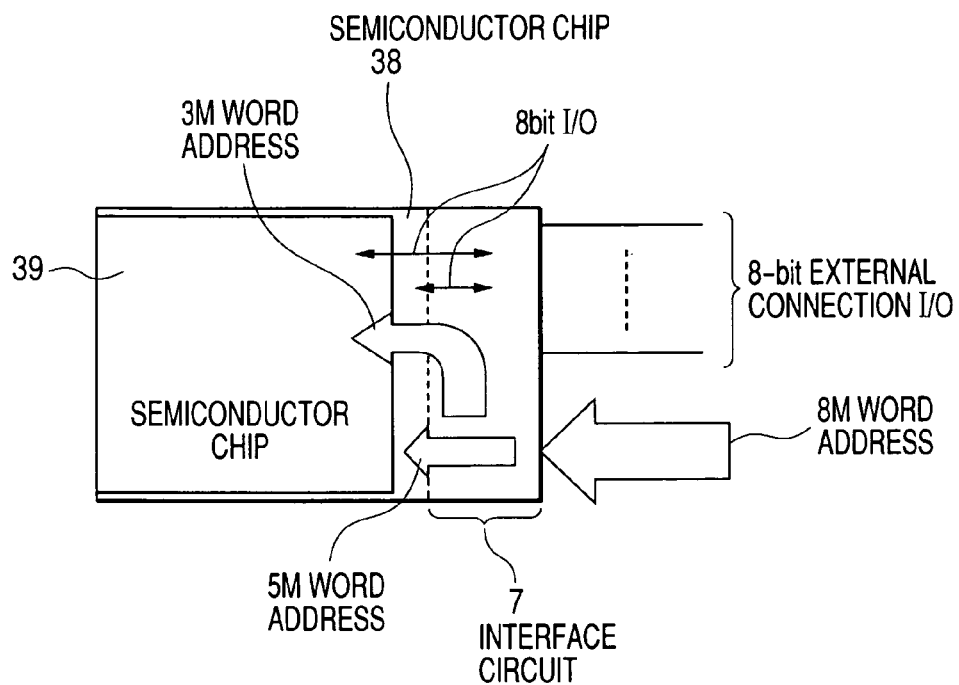
FIG. 12 shows a word address configuration in the memory of a stacked chip semiconductor device according to another embodiment of the present invention.

For example, it is also possible to combine a semiconductor chip (primary semiconductor chip) 38, which has a memory of 5M words×8 bits and an interface circuit 7, with a semiconductor chip (secondary semiconductor chip) 39 having a memory of 3M words×8 bits as shown in FIG. 12.

In this case, the interface circuit 7 incorporates a decoder circuit and 8M words address is decoded by the decoder circuit and distributed to 5M words address and 3Ms word address so that an external interface regards this as a memory of 8M words×8 bits.

Consequently, the memory packaging form can be diversified to suit the available packaging space and the device can be mounted in a module or memory card whose shape is restricted, and its memory capacity can be increased.

A function of protection against data leaks can be provided by adding a distribution rule encoding circuit to a decoder circuit which distributes the address space so that the security of the stacked chip semiconductor device is increased.

In the first to third embodiments, it is also possible to add a counter circuit which generates address signals for the semiconductor chips from clock signals.

Figure 13:
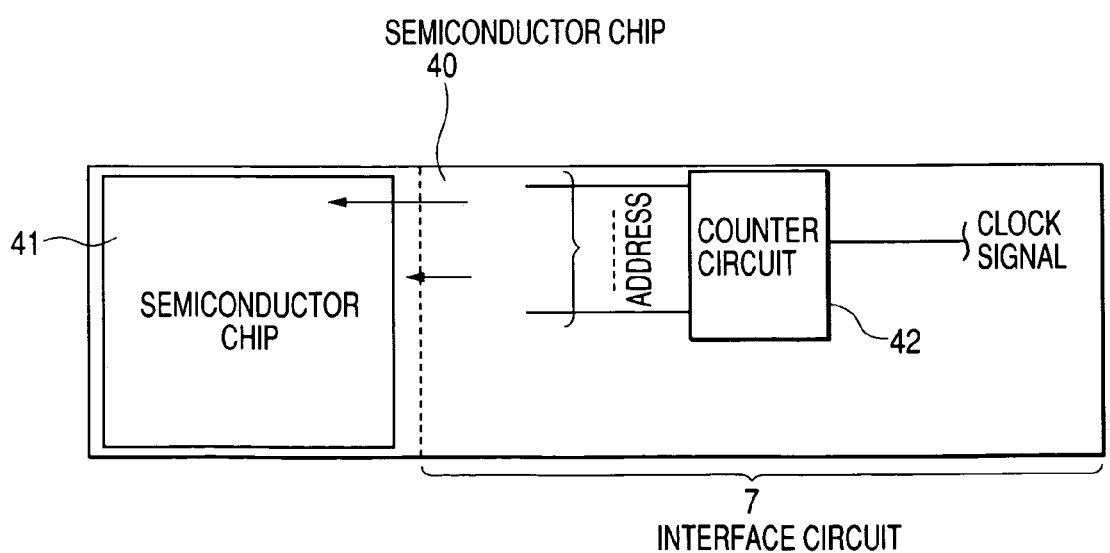
FIG. 13 illustrates an interface circuit as another example in a stacked chip semiconductor device according to another embodiment of the present invention.

FIG. 13 shows a stacked chip semiconductor device which includes two semiconductor chips 40 and 41. The semiconductor chip (primary semiconductor chip) 40 has a memory section and an interface circuit 7 and the semiconductor chip (secondary semiconductor chip) 41 only has a memory section. In this case, a counter circuit 42 is structured in the interface circuit 7 of the semiconductor chip 40.

Hence, a memory which permits serial access can be constituted using a random access memory, and a large capacity memory (stacked chip semiconductor device) with a smaller number of external connection terminals can be realized.

The semiconductor chip packaging technology used for semiconductor devices according to the present invention is suitable for high density packaging of stacked semiconductor chips.

What is claimed is:

1. A semiconductor device comprising:
a board;
a first semiconductor chip having an external connection electrode connected with an external connection terminal for receiving a signal from outside of the semiconductor device, a first electrostatic discharge protection circuit connected with the external connection electrode, a first internal connection electrode connected with the external connection electrode through the first electrostatic discharge protection circuit, and a first internal circuit connected to the first internal connection electrode, the first semiconductor chip being mounted on the board;
a bonding wire having an end connected with the first internal connection electrode; and
a second semiconductor chip having a second internal connection electrode connected with another end of the bonding wire, a second internal circuit connected to the second internal connection electrode, and a second electrostatic discharge protection circuit connected with the second internal connection electrode, the second electrostatic discharge protection circuit having a smaller area size than the first electrostatic discharge protection circuit, and the second semiconductor chip being stacked on the first semiconductor chip so that a part of the second semiconductor chip overlaps the first semiconductor chip;
wherein each of a size of the external connection electrode and a size of the second internal connection electrode is less than a size of the first internal connection electrode.

2. The semiconductor device of claim 1,
wherein the first semiconductor chip has a first side and a second side;
wherein the external connection electrode and the first internal connection electrode are gathered in a part of the first side of the first semiconductor chip;
wherein the second semiconductor chip has a first side and a second side; and
wherein the second semiconductor chip is stacked on the first semiconductor chip so that the external connection electrode and the first internal connection electrode are exposed from the second semiconductor chip and the first side of the first semiconductor chip is arranged side by side with the first side of the second semiconductor chip.

3. The semiconductor device according to claim 1,
wherein the first semiconductor chip includes a memory controller; and
wherein the second semiconductor chip includes a semiconductor memory controlled by the memory controller.

4. The semiconductor device according to claim 1, wherein the first semiconductor chip and the second semiconductor chip include semiconductor memories.

5. The semiconductor device according to claim 4, wherein the first semiconductor chip includes a counter circuit which generates address signals for the first semiconductor chip and the second semiconductor chip from clock signals inputted from outside the semiconductor device.

6. The semiconductor device according to claim 5, wherein the first semiconductor chip includes a security portion for encoding/decoding signals which are inputted from, or outputted to, outside the semiconductor device.

* * * * *